US010961976B2

United States Patent
Nguyen et al.

(10) Patent No.: US 10,961,976 B2
(45) Date of Patent: Mar. 30, 2021

(54) METHOD FOR CONTROLLING A WAVE-ENERGY SYSTEM BY DETERMINING THE EXCITATION FORCE APPLIED BY WAVES INCIDENT UPON A MOVING PART OF THE SAID SYSTEM

(71) Applicant: IFP Energies nouvelles, Rueil-Malmaison (FR)

(72) Inventors: Hoai-Nam Nguyen, Lyons (FR); Paolino Tona, Lyons (FR)

(73) Assignee: IFP ENERGIES NOUVELLES, Rueil-Malmaison (FR)

( * ) Notice: Subject to any disclaimer, the term of this patent is extended or adjusted under 35 U.S.C. 154(b) by 86 days.

(21) Appl. No.: 16/091,868

(22) PCT Filed: Feb. 15, 2017

(86) PCT No.: PCT/EP2017/053375
§ 371 (c)(1),
(2) Date: Oct. 5, 2018

(87) PCT Pub. No.: WO2017/174244
PCT Pub. Date: Oct. 12, 2017

(65) Prior Publication Data
US 2019/0093623 A1 Mar. 28, 2019

(30) Foreign Application Priority Data

Apr. 8, 2016 (FR) ...................... 1653109

(51) Int. Cl.
*F03B 15/00* (2006.01)
*F03B 13/16* (2006.01)
(Continued)

(52) U.S. Cl.
CPC ............ *F03B 15/00* (2013.01); *F03B 11/008* (2013.01); *F03B 13/16* (2013.01);
(Continued)

(58) Field of Classification Search
CPC ........ F03B 11/008; F03B 13/16; F03B 15/00; F05B 2210/11; F05B 2260/84;
(Continued)

(56) References Cited

U.S. PATENT DOCUMENTS 8,587,139 B2 * 11/2013 Gerber .................. F03B 13/16
290/42
10,415,537 B2 * 9/2019 Abdelkhalik ........... F03B 13/16
(Continued)

FOREIGN PATENT DOCUMENTS

WO 2009081042 7/2009
WO 2009/148531 A1 12/2009

OTHER PUBLICATIONS

International Search Report for PCT/EP2017/053375, dated Jun. 26, 2017; English translation submitted herewith (7 pgs.).
(Continued)

*Primary Examiner* — Tulsidas C Patel
*Assistant Examiner* — S. Mikailoff
(74) *Attorney, Agent, or Firm* — Fitch, Even, Tabin & Flannery LLP

(57) ABSTRACT

The invention relates to the real-time determination of the forces applied by waves incident upon the moving part (2) of a wave-energy system (1). The method according to the invention is based on the construction of a model of the radiation force applied to the moving part (2) and a model of the dynamics of the wave-energy system (1). The invention uses only measurements of the kinematics of the moving part (2) and the force applied by the conversion machine (3) to the moving part (2).

15 Claims, 5 Drawing Sheets

(51) Int. Cl.
*H02P 21/18* (2016.01)
*F03B 11/00* (2006.01)
*H02P 21/00* (2016.01)
*H02P 21/13* (2006.01)
*H02P 21/14* (2016.01)
*H03H 17/02* (2006.01)
*H02P 101/10* (2015.01)

(52) U.S. Cl.
CPC ......... *H02P 21/0017* (2013.01); *H02P 21/13* (2013.01); *H02P 21/143* (2013.01); *H02P 21/18* (2016.02); *H03H 17/0202* (2013.01); *F05B 2210/11* (2013.01); *F05B 2260/84* (2013.01); *F05B 2270/20* (2013.01); *F05B 2270/30* (2013.01); *F05B 2270/70* (2013.01); *H02P 2101/10* (2015.01); *H03H 2017/0205* (2013.01); *Y02E 10/30* (2013.01)

(58) Field of Classification Search
CPC .............. F05B 2270/20; F05B 2270/30; F05B 2270/70; H02P 2101/10; H02P 21/0017; H02P 21/13; H02P 21/143; H02P 21/18; H03H 17/0202; H03H 2017/0205; Y02E 10/38
See application file for complete search history.

(56) References Cited

U.S. PATENT DOCUMENTS

| | | | | |
|---|---|---|---|---|
| 10,697,422 | B2* | 6/2020 | Nguyen | F03B 13/16 |
| 10,815,959 | B2* | 10/2020 | Tona | F03B 15/00 |
| 2010/0148504 | A1* | 6/2010 | Gerber | F03B 13/16 |
| | | | | 290/42 |
| 2017/0298899 | A1* | 10/2017 | Abdelkhalik | F03B 15/00 |
| 2018/0313321 | A1* | 11/2018 | Nguyen | F03B 13/08 |
| 2019/0093623 | A1* | 3/2019 | Nguyen | F03B 13/16 |
| 2019/0128236 | A1* | 5/2019 | Ringwood | F03B 13/14 |
| 2019/0277244 | A1* | 9/2019 | Tona | F03B 13/187 |

OTHER PUBLICATIONS

Lopes M F P et al: "Experimental and numerical investigation of non-predictive phase-control strategies for a point-absorbing wave energy converter", Ocean Engineering, Pergamon, Amsterdam, NL, vol. 36, No. 5, Apr. 1, 2009 (Apr. 1, 2009), pp. 386-402, XP026067007.
Edo Abraham et al: 11 Optimal Active Control and Optimization of a Wave Energy Converter, IEEE Transactions on Sustainable Energy, IEEE, USA, vol. 4, No. 2, Apr. 1, 2013 (Apr. 1, 2013), pp. 324-332, XP011497607.
Francesco Fusco et al: "A Simple and Effective Real-Time Controller for Wave Energy Converters", IEEE Transactions on Sustainable Energy, IEEE, USA, vol. 4, No. 1, Jan. 1, 2013 (Jan. 1, 2013) , pp. 21-30, XP011479415.

* cited by examiner

US 10,961,976 B2

METHOD FOR CONTROLLING A WAVE-ENERGY SYSTEM BY DETERMINING THE EXCITATION FORCE APPLIED BY WAVES INCIDENT UPON A MOVING PART OF THE SAID SYSTEM

CROSS REFERENCE TO RELATED APPLICATIONS

Reference is made to PCT/EP2017/053375 filed Feb. 15, 2017, and French Application No. 16/53.109 filed Apr. 8, 2016, which are incorporated herein by reference in their entirety.

BACKGROUND OF THE INVENTION

Field of the Invention

The invention relates to the sector of devices for converting the energy of waves into electrical energy. In particular, the invention relates to the sector dealing with determination of the excitation force of waves incident upon a moving part, in particular for controlling a wave-energy system.

Description of the Prior Art

For some years there has been a growing interest in renewable energy resources. These resources are clean, free and limitless, which has major advantages in a world where there is a relentless decrease in the fossil fuel reserves available and a growing awareness of the need to preserve the planet. Among these resources, wave power energy, which is a relatively unknown energy source compared to other widely advertised energy sources such as wind power and solar energy, helps ensure an indispensable diversification of the renewable energy sector. The devices commonly known as "wave-energy converters" are of particular interest because they allow electricity to be produced from this renewable energy source (potential and kinetic energy of waves) without the emission of greenhouse gases. They are particularly suitable for providing electricity in isolated island areas.

For example, the patent applications FR 2876751 and WO 2009/081042 describe apparatus for capturing the energy produced by the sea tide. These devices are composed of a floating support on which a pendulum is mounted which is movable in relation to the floating support. The relative movement of the pendulum in relation to the floating support is used to produce the electrical energy by use of an energy conversion machine (for example an electrical machine). The conversion machine operates both as a generator and as a motor. In fact, in order to provide a torque or a force which drives the moving element, power is supplied to the conversion machine in order to place the moving element in synchronism with the waves (motor mode). On the other hand, in order to produce a torque or force which resists the movement of the moving element, power is recovered via the conversion machine (generator mode).

In order to improve the performance and therefore the profitability of the devices for converting the energy of waves into electrical energy (wave-energy systems), it is of interest to estimate the excitation force applied by the wave incident upon the wave-energy system.

The force applied by waves to the devices for converting the energy of the waves into electrical energy or other forms of exploitable energy, commonly known as wave-energy converters, cannot be directly measured under normal operating conditions in an industrial context. In the case of oscillating point converters, it is possible to carry out specific tests which keepi the floating part of the machine still and measuring the force needed to oppose the action of the wave (namely to keep the float immobile) by use of one or more (force or torque) sensors positioned on the conversion machine, also referred to as a "power take-off" (PTO) system, which for example may be an electric generator combined with a device allowing transmission of the oscillating movement of the moving part. In present-day terminology, the quantity thus measured is called the excitation force of the incident swell (or wave). This is distinguished in particular from the force (and the swell) generated by the movement itself of the float (radiation force). During normal operation of the float, on the other hand, the same force sensors will measure only the force applied by the PTO and not the excitation force of the incident wave. It would be possible, in principle, to calculate all the forces applied by the wave by incorporating pressure measurements obtained from sensors distributed over the whole surface, but this represents a costly and unreliable solution which may be difficult to implement in an industrial context.

Few scientific studies exist in the field of real-time estimation of the excitation force (or torque) of waves. Among those which exist there is, for example, the publication by Peter Kracht, Sebastian Perez-Becker, Jean-Baptiste Richard and Boris Fischer: "Performance Improvement of a Point Absorber Wave-Energy system by Application of an Observer-Based Control: Results from Wave Tank Testing". In IEEE Transactions on Industry Applications, July 2015, which describes an algorithm for estimating the force of the wave, which is based on a bank of independent harmonic oscillators and a Luenberger observer. The results obtained with this method show that the estimations are significantly delayed (out-of-phase) in relation to the real excitation force, which poses problems in particular for use in connection with control of the wave-energy system. More generally, this approach considers a fixed frequency range (chosen a priori) for the wave spectrum. In order for the method to be able to work in realistic conditions, where the spectrum varies over time, a very large number of frequencies must be taken into account, and this makes the approach very complex in terms of calculations. In the publication by Bradley A Ling: "Real-Time Estimation and Prediction of Wave Excitation Forces for Wave Energy Control Applications", published in ASME 2015 34th International Conference on Ocean, Offshore and Arctic Engineering, an approach is described based on an extensive Kalman filter which reconstructs the spectrum where the excitation force of the wave is regarded as being a (single) sinusoid and the parameters (amplitude, frequency and phase) vary over time. However, the method may be effectively used only for waves in a very narrow frequency range.

Moreover, French patent application FR2973448 which corresponds to U.S. Pat. No. 9,261,070 describes a control method for oscillating point converters. One of the steps involves the estimation (of the spectrum) of the force of the wave on the float (or of the torque on the moving part of the converter), using a set of sinusoids and a Luenberger observer. The method resembles that published in the aforementioned documents and has a priori the same drawbacks.

SUMMARY OF THE INVENTION

The invention improves the operation of a wave-energy system by determining in real time the forces applied by waves incident upon the moving part to adjust consequently in an optimum manner the electrical energy recovery operations. The method according to the invention is based on the construction of a model of the radiation force applied to the moving part and a model of the dynamics of the wave-energy system. The invention uses only measurements of the kinematics of the float (position, speed and if necessary acceleration) and the force applied by the conversion machine. These measurements are normally available on a wave-energy system, because they are used for control and management thereof. Thus, owing to the models that are used, it is possible to estimate the force applied by the incident wave for the entire range of frequencies of the waves, while maintaining a calculation time which is suitable for real-time determination and control.

The invention is a method for controlling a wave-energy system by determining the excitation force applied by waves incident upon a moving part of a wave-energy system the wave-energy system converting the energy of the waves into energy by use of the moving part cooperating with a conversion machine, the moving part performing a movement in relation to the conversion machine as a result of the action of the waves. For this method, the following steps are performed:
  a) measuring of the position and speed of the moving part;
  b) measuring of the force $F_u$ by the conversion machine to the moving part;
  c) constructing a model of the radiation force $F_{rad}$ applied to the moving part, the model of the radiation force $F_{rad}$ relating the radiation force to the speed of the moving part;
  d) constructing a model of the dynamics of the wave-energy system which relates the excitation force $F_{ex}$ applied by waves incident upon the moving part, to the position of the moving part, to the speed of the moving part, to the force $F_{ex}$ applied by the conversion machine to the moving part, and to the radiation force $F_{rad}$ applied to the moving part; and
  e) determining the excitation force $F_{ex}$ applied by waves incident upon the moving part by use of the model of the dynamics, the model of the radiation force, the position and measured speed and the measured force $F_u$ applied by the conversion machine to the moving part; and
  f) controlling the wave-energy system depending on the determined excitation force $F_{ex}$ applied by waves incident upon the moving part.

According to one embodiment, the model of the dynamics of the wind-energy system is constructed by use of an equation of the type: $M\ddot{z}(t)=F_{ex}(t)+F_{hd}(t)+F_{rad}(t)-F_u(t)$ where M is the mass of the moving part, $\ddot{z}$ is the acceleration of the moving part, and Fhd is the hydrostatic restoring force applied to the moving part.

According to an alternative, the hydrostatic restoring force Fhd is determined by use of a formula of the type:
$F_{hd}(t)=-Kz(t)$ where z is the position of the moving part and K is the hydrostatic stiffness coefficient.

Alternatively, the hydrostatic restoring force Fhd is determined by means of a piecewise affine function of the type: $F_{hd}=-F_i z(t)-G_i$ for at least two variation intervals $\Omega_i$ of the position z, where Fi and Gi are constant coefficients of the affine function for each interval $\Omega_i$.

According to a mode of implementation the model of the radiation force Frad is constructed by an equation of the type: $F_{rad}(t)=-M_\infty \ddot{z}(t)-F_r(t)$ where $F_r(t)=\int_0^t h(t-\tau)\dot{z}(\tau)d\tau$ is the radiation damping, $\ddot{z}$ is the acceleration of the moving part, $M_\infty$ is the mass added to the infinitely high frequency, $\dot{z}$ is the speed of the moving part, h is the pulse response which relates the speed of the moving part to the radiation damping.

Advantageously, the acceleration of the moving part is measured.

According to a first embodiment, the radiation damping Fr is determined by an appointed time response resulting from a state realization, of the type: $F_r(t)=C_r\int_0^t e^{(t-\tau)A_r}B_r\dot{z}(t)d\tau+D_r\dot{z}(t)$ where $A_r$, $B_r$, $C_r$, and $D_r$ are matrices of the state realization.

Preferably, the excitation force Fex applied by waves incident upon the moving part (2) is determined by use of an equation of the type $\hat{F}_{ex}(k)=(M+M_\infty)\ddot{z}(k)+\Sigma_{l=0}^{k-1}C_{rd}A_{rd}^{k-1-l}B_{rd}\dot{z}(l)+D_{rd}\dot{z}(k) F_i z(k)+G_i+F_u(k)$ where k is the time step in the discrete domain, and $A_{rd}$, $B_{rd}$, $C_{rd}$, and $D_{rd}$ are the matrices of the realization state in the discrete domain.

According to a second embodiment, the excitation force Fex applied by waves incident upon the moving part is determined by a state observer based on a linear Kalman filter constructed using a random-walk model of the excitation model Fex applied by waves incident upon the moving part.

Advantageously, the excitation force Fex applied by waves incident upon the moving part is determined by performing the following steps:
  i) initialization of k=0, the state vector $\hat{x}_a(0|0)=\bar{x}_a(0)$ and the state of the covariance matrix, $P(0|0)=P_0$;
  ii) at each instant k, acquisition of the position and speed measurements of the moving part $y(k)=[z(k)\ \dot{z}(k)]$ and measurement of the force applied by the said conversion machine to the moving part $u(k)=F_u(k)$; and
  iii) at each instant k, determination of the excitation force applied by waves incident upon the moving part (2) $\hat{w}(k)$ by use of the following equations:

$\hat{w}(k)=[0\ 1]\hat{x}_a(k|k)$ where:

$$\begin{cases} \hat{x}_a(k|k-1) = A_a\hat{x}_a(k-1|k-1) + B_aF_u(k-1) \\ P(k|k-1) = A_aP(k-1|k-1)A_a^T + Q \end{cases},$$

$$K(k) = P(k|k-1)C_a^T(C_aP(k|k-1)C_a^T + R)^{-1}$$

$$\hat{x}_a(k|k) = \hat{x}_a(k|k-1) + K(k)(y(k) - C_a\hat{x}_a(k|k-1) - D_aF_u(k))$$

$$P(k|k) = (I - K(k)C_a(k))P(k|k-1)$$

where K(k) is the gain of the observer, $x_a(k)$ is the unknown state vector $$x_a(k) = \begin{bmatrix} x(k) \\ w(k) \end{bmatrix},$$

$A_a$, $B_a$, $C_a$, $D_a$ are state realization matrices, P is the covariance matrix of the state vector, and Q and R are calibration matrices.

According to a third embodiment, the excitation force Fex applied by waves incident upon the moving part is determined by use of an unknown input state estimator based on a moving-horizon approach.

According to a characteristic feature, the said excitation force Fex applied by waves incident upon the moving part is determined by performing the following steps at each instant k:
  i) acquisition of the position and speed measurements of the moving part $y(k)=[z(k)\ \dot{z}(k)]$ and measurement of the said force applied by the conversion machine to the moving part $u(k)=F_u(k)$; and ii) determination of the excitation force applied by waves incident upon the moving part $\hat{w}(k|k)$ by use of the following equations: $\hat{w}(k|k)=\xi(N)$ where $\xi(N)$ is obtained by means of resolution of a quadratic programming problem:

$$\begin{cases} \min_{\xi} \left\{ \xi^T(P+\Psi_s^T R\Psi)\xi - 2[\hat{w}_0^T \ \hat{x}_0^T \ V^T] \begin{bmatrix} S \\ R\Psi_s \end{bmatrix} \xi \right\} \\ \text{such as } H_\xi \xi \leq g_\xi + H_d U_d \end{cases}$$

where P, R and S are matrices formed from cost function weighting matrices, $\xi$ is the matrix which represents all values of the unknown values in the estimation window of size N, $\Psi_s$ is the matrix, calculated using the state-space representation, which corresponds to the effect of these variables on the values of the outputs in its window, $H_\xi$ and $H_d$ are matrices and $g_\xi$ is a vector obtained from constraints imposed on the state and the unknown input, $\hat{x}_0=\hat{x}(k-N|k-1)$ and $\hat{w}_0=\hat{w}(k-N|k-1)$ where x is the state vector and w is the unknown input of the state estimator, $$U_d = \begin{bmatrix} u_d(k-N) \\ u_d(k-N+1) \\ \vdots \\ u_d(k) \end{bmatrix},$$

$u_d$ is for known input of the state estimator where $u_d(t)=F_{hd}(t)-F_u(t)$.

According to a mode of implementation, operation of the wave-energy system is controlled depending on the determined excitation force Fex applied by waves incident upon the moving part.

BRIEF DESCRIPTION OF THE DRAWINGS

Further characteristic features and advantages of the method according to the invention will become clear from a reading of the description below of non-limiting examples of embodiment, with reference to the attached figures described below.

DETAILED DESCRIPTION OF THE INVENTION

The present invention relates to the determination of the excitation force applied by waves incident upon a moving part of a wave-energy system, also called an excitation force of the swell or wave. A wave-energy system is a system which converts the energy of the wave into recoverable energy, in particular electrical energy. A wave-energy system generally comprises a moving part, which is also called a pendulum or float, which has an oscillating movement when acted on by the wave. The moving part cooperates with a conversion machine, called also "power take-off" (PTO) system, which in most cases comprises an electrical generator connected to a device allowing the transmission of the oscillating movement to be adapted, to convert the movement of the moving part into recoverable energy. In certain cases, the conversion machine may act as a motor generating a force on the moving part. In fact, in order to recover power via a conversion machine, a torque or force which resists the movement of the moving element is produced (generator mode). On the other hand, if the conversion machine allows, power may be supplied to the conversion machine to provide a torque or a force which drives the moving element to help the moving platform become synchronized with the waves (motor mode). The method according to the invention relates to the control of a wave-energy system depending on the determined excitation force.

The method according to the invention is suitable for all types of wave-energy systems with at least one moving part, for example those described in the French patent application FR2973448 which corresponds to U.S. Pat. No. 9,261,070. The control method according to the invention may also be applied to a wave-energy system belonging to the category of wave-energy systems with oscillating water columns (OWC).

Figure 1:
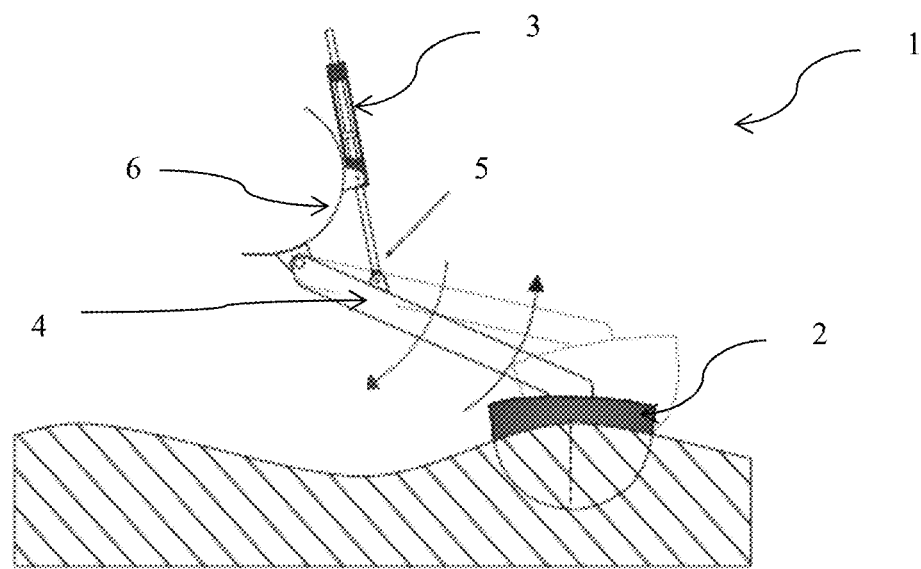
FIG. 1 shows a wave-energy system according to an embodiment of the invention.

FIG. 1 shows, in schematic form, a non-limiting example of a wave-energy system 1. The wave-energy system 1 comprises a floating moving part 2 (the wave is represented in schematic form by the hatched area). Movement of the moving part 2 in response to waves communicates motion via lever arm 4 to a conversion machine 3 which is an electrical generator that as illustrated is a linear generator. The lever arm 4 and the electrical generator 3 are pivotably mounted relative to an installation 6. The movements of the lever arm 4 are indicated in schematic form by use of arrows.

In the description of the invention, the terms "waves", "sea tides" and "swell" are considered to be equivalent.

Moreover, in the description and the claims, the term "force" indicates a force or a torque. Similarly, the terms "position", "speed" and "accelerations" all indicate values which are "linear" or "angular", whereby the "linear" values may be associated with forces, and the "angular" values may be associated with "torques".

Furthermore, for better comprehension, the different models are shown in a single dimension; however, the method according to the invention is suitable for models with various dimensions, designed for systems which have several degrees of freedom in their movement.

The method according to the invention comprises the following steps:
1) measuring of the position and speed of the moving part;
2) measuring of the force applied by the conversion machine (or PTO)
3) constructing a radiation force model
4) constructing a model of dynamics
5) determining an excitation force of an incident wave
6) controlling the wave-energy system
1) Measurement of the Position and Speed of the Moving Part During this step, the position and the speed of the moving part are measured. The position corresponds to the movement (for example distance or angle) in relation to the equilibrium position of the moving part. These measurements may be carried out by sensors, which are generally provided on a wave-energy system for at least one of control and management thereof.

According to a mode of implementation of the invention, during this step, it is also possible to measure or estimate the acceleration of the moving part, since this measurement or estimation may be used in the models implemented by the method according to the invention. For example, the acceleration may be measured by means of an accelerometer mounted on the moving part.

2) Measurement of the Force Applied by the Conversion Machine (PTO)

During this step, the force (or if applicable the torque) applied by the conversion machine (PTO) to the moving part is measured. This measurement may be performed by means of a sensor, which may be a force sensor or a torque sensor. This type of sensor is often installed, or may be easily installed in wave-energy systems, for at least one of control and management thereof. Alternatively, the measurement may be replaced by an estimation carried out based on a set force (or torque) value applied to the PTO.

By way of example of the wave-energy system shown in FIG. 1, a torque sensor 5 may be arranged between the lever arm 4 and the electric generator 3.

3) Construction of a Radiation Force Model

During this step, a model of the radiation force applied to the moving part is constructed. According to the linear wave theory (as described for example in the document by Falnes J, Kurniawan A. "Fundamental formulae for wave-energy conversion". R. Soc. open sci. 2: 140305, 2005, http: //dx. doi. org/10. 1098/rsos. 140305), the radiation force is produced by the oscillation of an immersed body (and therefore depends on the movement of the moving part), while the excitation force, resulting from the presence itself of a body in the water, does not depend on the movement of the immersed body, but on the incident wave. If there is no incident wave, the radiation force dampens the residual oscillation of the immersed body until it causes it to stop. It is important to note that, although the linear theory allows the excitation force to be related to the height of the incident wave by use of a linear model (in the frequency or time domain), in practice it may not be used to calculate the excitation force linearly, even if it was possible to measure the height of the wave at the center of gravity of the float as required by the theory. In fact, the linear relation between height of the wave and excitation force is not random, which means that the excitation force cannot be calculated at a given instant without knowing the height of the wave in future instants (the calculation may on the other hand be performed non-linearly once the wave has passed). In the context of real-time control, the excitation force may therefore not be regarded as being a totally unknown exogenous force acting on the float. On the other hand, still according to the linear wave theory, the radiation force is related to the movement of the float and more precisely to its acceleration and its speed by a random model which is linear (in the frequency or time domain). It may therefore be calculated linearly using the current acceleration and speed measurements (and past speed measurements).

According to a mode of implementation of the invention, the model of the radiation force Frad is constructed by an equation of the type:

$$F_{rad}(t) = -M_\infty \ddot{z}(t) - F_r(t);$$

where $F_r(t) = \int_0^t h(t-\tau)\dot{z}(\tau)d\tau$ is the component of the radiation force $F_{rad}$ which depends on the (current and past) speed of the moving part, which is called radiation damping;

$\ddot{z}$ is the acceleration of the moving part;

$M_\infty$ is the mass added to the infinitely high frequency, which may be obtained by means of codes of BEM (Boundary Element Method) calculation codes, such as WAMIT® (WAMIT, USA), or Nemoh® (Ecole Centrale de Nantes, France), based on the geometry of the moving part;

$\dot{z}$ is the speed of the moving part;

h is the pulse response which relates the speed of the moving part to the radiation damping, the coefficients of which are obtained from the hydrodynamic parameters of the moving part calculated by the same BEM calculation codes.

The construction of this model allows the determination at any instant of the radiation force, with a limited calculation time. Thus the determination of the force applied by the wave may be determined at any instant with a short calculation time.

4) Construction of Model of Dynamics of the Wave-Energy System

During this step, a model of dynamics of the wave-energy system is constructed. "Dynamics model" refers to a model which relates the excitation force applied by waves incident upon the moving part, the radiation force applied to the moving part, the hydrostatic restoring force applied to the moving part and the force applied by the conversion on the moving part, to the position and speed of the moving part. With this type of model, it is possible to obtain results representing the behavior of the wave-energy system, if the movements are not too big.

Advantageously, the model of dynamics is obtained by applying the fundamental principle of dynamics (Newton's second law) to the moving part.

According to a mode of implementation of the invention, where the forces are considered, the dynamics model of the wave-energy system may be constructed by an equation of the type:

$$M\ddot{z}(t) = F_{ex}(t) + F_{hd}(t) + F_{rad}(t) - F_u(t)$$

where M is the mass of the moving part;

$\ddot{z}$ is the acceleration of the moving part;

$F_{ex}$ is the excitation force applied by waves incident upon the moving part;

$F_{rad}$ is the radiation force applied to the moving part;

$F_{hd}$ is the hydrostatic restoring force applied to the moving part; and $F_u$ is the force applied by the conversion machine to the moving part.

This model translates a vertical translation movement typical of floats which have a pitching movement. This model is derived from the linear wave theory.

In accordance with a first variation of embodiment, the hydrostatic restoring force applied to the moving part may be approximated using a linear function of the position z defined in relation to the equilibrium position. In this case, the hydrostatic restoring force may be written by a function of the type: $F_{hd}(t) = -Kz(t)$ where z is the position of the moving part defined in relation to its equilibrium position and K is the hydrostatic stiffness coefficient. Thus, the hydrostatic restoring force may be calculated using a simple model if the measurement of the position z is available. This function is particularly suitable for small displacements z.

Figure 2:
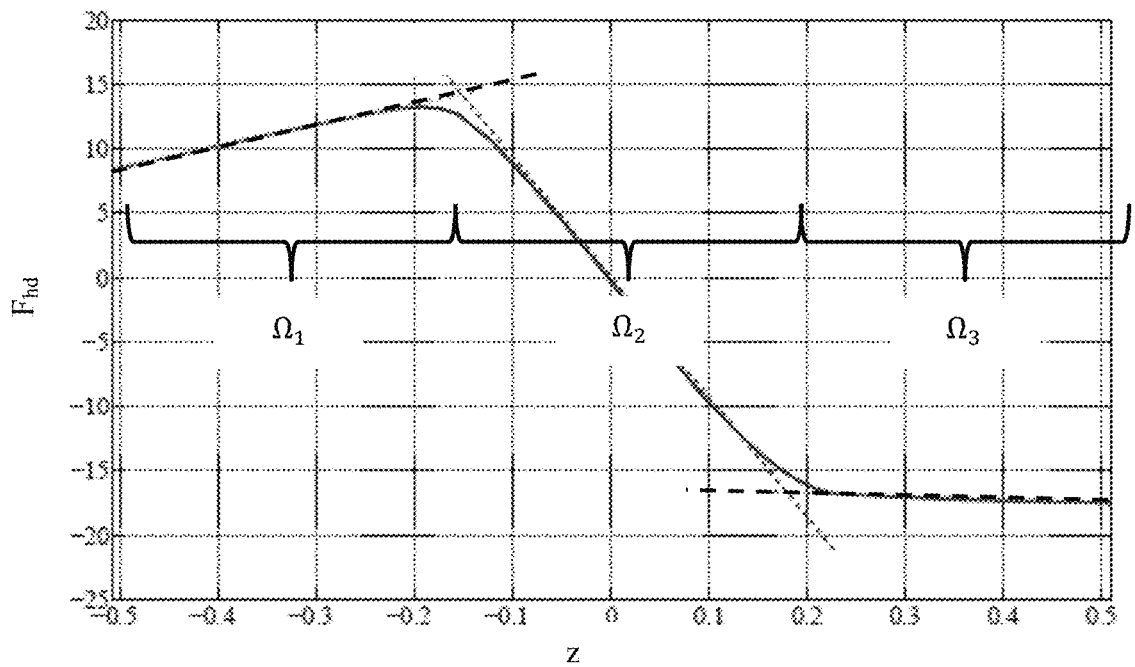
FIG. 2 shows an approximation of the hydrostatic restoring force as a function of the position according to an example.

According to a second variation of embodiment, the hydraulic restoring force applied to the moving part may be approximated using a piecewise affine function of the position z. The function may be linear for at least two—preferably three—intervals of the position z. In this case, the hydrostatic restoring force may be written by a function of the type: $F_{hd}=-F_i z(t)-G_i$ for at least two variation intervals $\Omega_i$ of the position z, where Fi and Gi are constant coefficients of the affine function for each interval $\Omega_i$. This function is particularly suitable for the larger movements z. FIG. 2 illustrates this approximation. FIG. 2 shows in continuous lines, in a schematic and non-limiting manner, the variations of the hydrostatic restoring force Fhd as a function of the position z. This figure shows in broken lines the linear functions of each piece $\Omega_1$, $\Omega_2$ and $\Omega_3$. It can be noted that this piecewise affine function allows a better approximation of the hydrostatic restoring force over the whole of the variation range of the position z.

According to a mode of implementation of the invention, where the torques are considered, the model of dynamics of the wave-energy system may be constructed by an equation of the type:

$$J\ddot{\theta}=M_{ex}(t)+M_{hyd}(t)+M_{rad}(t)-M_u(t)$$

where J is the inertia of the moving part;
$\ddot{\theta}$ is the angular acceleration of the moving part;
$M_{ex}$ is the excitation torque applied by waves incident upon the moving part;
$M_{rad}$ is the radiation torque applied to the moving part;
$M_{hd}$ is the hydrostatic restoring torque applied to the moving part; and
$M_u$ is the torque applied by the conversion machine to the moving part.

This model converts a rotational movement about a horizontal axis (typical of floats which have a pitching movement). This model is derived from the linear wave theory. This model is a "mirror" of the model where the forces are considered: the various terms of the model are of the same nature.

In the same way as for the hydrostatic restoring force, the hydrostatic restoring torque may be approximated by a linear function or by a piecewise affine function.

In the description below, only the example relating to forces will be described, but the example relating to torques may be deduced by use of transposition of the equations in an angular reference system.

5) Determination of the Excitation Force Applied by Incident Waves

During this step, the excitation force applied by waves incident upon the moving part is determined by use of:
  measurements of the position and speed (and optionally acceleration) of the moving part,
  measurement of the force applied by the conversion machine (PTO) to the moving part,
  the model of the radiation force, and
  the dynamics model of the wave-energy system.

According to a first embodiment of the invention (described in detail below), it is possible to determine the excitation force applied by waves incident upon the moving part using the calculation of an approximation of the radiation force. This embodiment has the advantage that a representation of the hydrostatic restoring force by a piecewise affine function may be taken into account.

According to a second embodiment of the invention (described in detail below), the excitation force applied by waves incident upon the moving part may be determined by use of a state observer based on a linear Kalman filter constructed using a random-walk model of the excitation force applied by waves incident upon the moving part. This second embodiment has the advantage that uncertainty factors are taken into account.

According to a third embodiment of the invention (described in detail below), the excitation force applied by waves incident upon the moving part may be determined by use of an unknown input state estimator based on a moving-horizon approach. This embodiment has the advantage that uncertainty factors are taken into account. Moreover a representation of the hydrostatic restoring force by a piecewise affine function may be taken into account.

Other embodiments may be envisaged.

First Embodiment

According to the first embodiment of the invention, it is possible to determine the excitation force applied by waves incident upon the moving part using the calculation of an approximation of the radiation force.

For this embodiment, the acceleration of the moving part is also measured. Prior to this step, the following are therefore known:
  the measurements of the position z, speed $\dot{z}$ and acceleration $\ddot{z}$ of the moving part,
  the measurement of the force $F_u$ applied by the conversion machine (PTO) to the moving part,
  the model of the radiation force $F_{rad}(t)=-M_\infty \ddot{z}(t)-F_r(t)$ where $F_r(t)=\int_0^t h(t-\tau)\dot{z}(\tau)d\tau$, and
  the model of dynamics of the wave-energy system $M\ddot{z}(t)=F_{ex}(t)+F_{hd}(t)+F_{rad}(t)-F_u(t)$.

Thus, from knowing how to calculate $F_r$ it is therefore possible to obtain $F_{rad}$, and finally $F_{ex}(t)$, which is the only unknown factor of the dynamics model of the wave-energy system.

However, it is not easy to perform the calculation of the convolution product within the time domain in the preceding expression for $F_r(t)$, because of the large number of mathematical operations which must be performed and data to be stored. In order to avoid this, it is possible to regard it as a linear system with $F_r(t)$ at the output and $\dot{z}(\tau)$ at the input. The resultant equation in the (Laplace) frequency domain, obtained by applying Prony's method, is:

$$F_r(s)=W_r(s)\dot{z}(s)$$

where $W_r(s)$ is a transfer function. The preceding equation, which was in the Laplace domain, may be expressed in an equivalent state form, for example:

$$\begin{cases} \dot{x}_r(t) = A_r x_r(t) + B_r \dot{z}(t) \\ F_r(t) = C_r x_r(t) + D_r \dot{z}(t) \end{cases}$$

where $x_r$ is an internal state which does not have any particular physical significance and ($A_r$, $B_r$, $C_r$, and $D_r$) are state realization matrices. It is to be noted that in system theory (and in automatic control engineering), a state-space representation allows a dynamic system to be modelled in matrix form using state variables. This representation may be linear or non-linear, continuous or discrete. The representation allows determination of the internal state and the outputs of the system at any future instant knowing the state at the initial instant and the behavior of the input variables which influence the system.

The state form allows the evolution in time of $F_r$ to be expressed as follows:

$$F_r(t)=C_r e^{tA_r}x_r(0)+C_r\int_0^t e^{(t-\tau)A_r}B_r \dot{z}(\tau)d\tau+D_r \dot{z}(t)$$

but this expression may not be used directly because the initial value of the internal state $x_r(0)$ is unknown. However, it is possible to approximate the time evolution $F_r$ as follows:

$$F_r(t) = C_r \int_0^t e^{(t-\tau)A_r} B_r \dot{z}(\tau) d\tau + D_r \dot{z}(t)$$

since $C_r e^{tA_r} x_r(0) \approx 0$ where $t$ is sufficiently great, given that the matrix $A_r$ is asymptotically stable for this type of system. This corresponds to ignoring the contribution of the initial state to the time evolution of $F_r$, knowing that it will recede very rapidly compared to the contribution linked to the speed $\dot{z}$.

The first embodiment therefore calculates $F_{ex}$ from $z$, $\dot{z}$, $\ddot{z}$ and $F_u$ (which are known) using an equation with the form:

$$\hat{F}_{ex}(t) = (M+M_\infty)\ddot{z}(t) + C_r \int_0^t e^{(t-\tau)A_r} B_r \dot{z}(t) d\tau + D_r \dot{z}(t) + Kz(t) + F_u(t)$$

if a linear model is used for the hydrostatic restoring force, or $$\hat{F}_{ex}(t) = (M+M_\infty)\ddot{z}(t) + C_r \int_0^t e^{(t-\tau)A_r} B_r \dot{z}(\tau) d\tau + D_r \dot{z}(t) + F_i z(t) + G_i + F_u(t)$$

for each interval $\Omega_i$ to which $z$ belongs, if a piecewise affine model is used for the hydrostatic restoring force.

Since in practice the measurements of $z$, $\dot{z}$, $\ddot{z}$ and $F_u$ are sampled signals, the algorithm may be developed within the discrete time $k$, discretizing as follows the state equation introduced beforehand in order to represent the evolution of $F_r$:

$$\begin{cases} x_r(k+1) = A_{rd} x_r(k) + B_{rd} \dot{z}(k) \\ F_r(k) = C_{rd} x_r(k) + D_{rd} \dot{z}(k) \end{cases}$$

$F_r$ may thus be expressed by an equation with the form:

$$F_r(k) = C_{rd} A_{rd}^k x_r(0) + \sum_{l=0}^{k-1} C_{rd} A_{rd}^{k-1-l} B_{rd} \dot{z}(l) + D_{rd} \dot{z}(k)$$

and its approximation expressed by the formula:

$$F_r(k) = \sum_{l=0}^{k-1} C_{rd} A_{rd}^{k-1-l} B_{rd} \dot{z}(l) + D_{rd} \dot{z}(k)$$

This gives (in the case where the hydrostatic restoring force is considered to be a piecewise affine function) the following expression:

$$\hat{F}_{ex}(k) = (M+M_\infty)\ddot{z}(k) + \Sigma_{l=0}^{k-1} C_{rd} A_{rd}^{k-1-l} B_{rd} \dot{z}(l) + D_{rd} \dot{z}(k) + F_i z(k) + G_i + F_u(k)$$

for each interval $\Omega_i$ to which $z(k)$ belongs.

The original aspect of this embodiment is the approximation of the time response of $F_r$, the radiation damping (the component of the radiation force dependent on the speed of the float), calculated by use of an equivalent state-space representation and ignoring the contribution of the initial state of this representation.

Second Embodiment

According to a second embodiment of the invention, the excitation force applied by waves incident upon the moving part may be determined by use of a state observer based on a linear Kalman filter constructed using a random-walk model of the excitation force applied by waves incident upon the moving part. It is pointed out that a state observer, or state estimator, is in automatic control engineering and system theory an extension of a model represented in the form of a state-space representation. When the system state cannot be measured, an observer allowing the state to be reconstructed from a model is constructed.

For this embodiment, prior to this step, the following are therefore known:
- the measurements of the position $z$, and speed $\dot{z}$ of the moving part,
- the measurement of the force $F_u$ applied by the conversion machine (PTO) to the moving part,
- the model of the radiation force $F_{rad}(t) = -M_\infty \ddot{z}(t) - F_r(t)$ where $F_r(t) = \int_0^t h(t-\tau)\dot{z}(\tau)d\tau$, and
- the model of dynamics of the wave-energy system $M\ddot{z}(t) = F_{ex}(t) + F_{hd}(t) + F_{rad}(t) - F_u(t)$.

In this approach, the problem of estimation of the excitation force of the waves is transformed into a classic state estimation problem (which may be resolved with a linear Kalman filter), where the dynamics of the excitation force of the waves are expressed by a random-walk model. The main advantage of this method is the taking into consideration of uncertainty factors which allows measurement noise and non-modelled dynamics to be taken into account.

By replacing in the equation which describes the movement of the float $$M\ddot{z}(t) = F_{ex}(t) + F_{hd}(t) + F_{rad}(t) - F_u(t)$$

the expressions for the hydrostatic restoring force (with the linear model) and the model of the radiation force $$F_{hd}(t) = -Kz(t)$$

$$F_{rad}(t) = -M_\infty \ddot{z}(t) - F_r(t)$$

the following is obtained $$(M+M_\infty)\ddot{z}(t) + Kz(t) + F_r(t) = F_{ex}(t) - F_u(t)$$

This equation may be expressed in state form, by defining $$\begin{cases} x_1(t) = z(t) \\ x_2(t) = \dot{z}(t) \end{cases}$$

which gives $$\begin{cases} \dot{x}_1(t) = x_2(t) \\ \dot{x}_2(t) = -\dfrac{K}{M+M_\infty} x_1(t) - \dfrac{1}{M+M_\infty} F_r(t) + \dfrac{1}{M+M_\infty}(F_{ex}(t) - F_u(t)) \end{cases}$$

In the same way as for the first embodiment, the dynamics of radiation damping $F_r(t)$ may be described by a state-space representation equivalent to the convolution product of the pulse response of the radiation damping and the speed of the moving part.

$$F_r(t) = \int_0^t h(t-\tau)\dot{z}(\tau)d\tau$$

namely $$\begin{cases} \dot{x}_r(t) = A_r x_r(t) + B_r \dot{z}(t) \\ F_r(t) = C_r x_r(t) + D_r \dot{z}(t) \end{cases}$$

or $$\begin{cases} \dot{x}_r(t) = A_r x_r(t) + B_r x_2(t) \\ F_r(t) = C_r x_r(t) + D_r x_2(t) \end{cases}$$

where $x_r$ is an internal (non-measurable) state which does not have any particular physical significance, and ($A_r$, $B_r$, $C_r$, $D_r$) are matrices of the state realization.

Combining the two state-space representations, the following are obtained:

$$\begin{cases} \dot{x}_1(t) = x_2(t) \\ \dot{x}_2(t) = -\frac{K}{M+M_\infty}x_1(t) - \frac{D_r}{M+M_\infty}x_2(t) - \frac{C_r}{M+M_\infty}x_r(t) + \frac{1}{M+M_\infty}(F_{ex}(t) - F_u(t)) \\ \dot{x}_r(t) = B_r x_2(t) + A_r x_r(t) \end{cases}$$

or, in an equivalent manner $$\begin{cases} \dot{x}(t) = A_c x(t) + B_c(F_{ex}(t) - F_u(t)) \\ y(t) = C_c x(t) \end{cases}$$

where $$x(t) = [x_1(t) \; x_2(t) \; x_r^T(t)]^T$$

$$y = \begin{bmatrix} x_1(t) \\ x_2(t) \end{bmatrix} \text{ and}$$

$$A_c = \begin{bmatrix} 0 & 1 & 0 \\ -\frac{K}{M+M_\infty} & -\frac{D_r}{M+M_\infty} & -\frac{C_r}{M+M_\infty} \\ 0 & B_r & A_r \end{bmatrix},$$

$$B_c = \begin{bmatrix} 0 \\ \frac{1}{M+M_\infty} \\ 0 \end{bmatrix}, C_c = \begin{bmatrix} 1 & 0 & 0 \\ 0 & 1 & 0 \end{bmatrix}$$

It is necessary to estimate $F_{ex}(t)$ using $y(t)$ (the vector which contains the position and the speed measurements of the moving part) and $F_u(t)$, the measurement of the force of the PTO.

In order to do this, first the state system above is discretized (it should be remembered that the measurements are sampled), using Tustin's method. This gives $$\begin{cases} x(k+1) = A_d x(k) + B_d(F_{ex}(k) - F_u(k)) \\ y(k) = C_d x(k) + B_d(F_{ex}(k) - F_u(k)) \end{cases}$$

It should be noted that it is important to perform discretization using Tustin's method which allows a direct term to appear in the output equation which allows $y(k)$ to be related to $F_{ex}(k)$, and therefore $F_{ex}(k)$ to be estimated using $y(k)$. This would not be possible with other discretization methods, which would relate $y(k)$ to $F_{ex}(k-1)$ and not to $F_{ex}(k)$.

By defining $$w(k) = F_{ex}(k), u(k) = F_u(k),$$

the global model of the float dynamics is obtained:

$$\begin{cases} x(k+1) = A_d x(k) + B_d w(k) - B_d u(k) \\ y(k) = C_d x(k) + D_d w(k) - D_d u(k) \end{cases}$$

In order to estimate the excitation force w(k), it is regarded as a state, the evolution of is defined by introducing a mathematical model which relates w(k) to w(k−1).

For this embodiment, a random-walk model is used to describe the evolution of the excitation force:

$$w(k+1) = w(k) + \epsilon_m(k)$$

where $\epsilon_m(k)$, which describes the variation of w(k), is regarded as a random number. In other words this model assumes that at each instant k the excitation force deviates by one random step (quantity) from its preceding value and that these steps are distributed independently and identically in terms of size.

This random-walk model of the excitation force is then combined with a dynamics model of the float:

$$\begin{cases} x(k+1) = A_d x(k) + B_d w(k) - B_d u(k) + \epsilon_x(k) \\ y(k) = C_d x(k) + D_d w(k) - D_d u(k) + \mu(k) \end{cases}$$

which is more resistant to modelling errors, owing to the introduction of $\epsilon_x(k)$ which represents the modelled dynamics (friction of the PTO, hydrostatic non-linearity, . . . ) and $\mu(k)$ which describes the measurement noise affecting the position and speed of the float.

By combining the random-walk model of the excitation force of the incident waves and the dynamics of the float. the increased state system is obtained:

$$\begin{cases} x(k+1) = A_d x(k) + B_d w(k) - B_d u(k) + \epsilon_x(k) \\ w(k+1) = w(k) + \epsilon_m(k) \\ y(k) = C_d x(k) + D_d w(k) - D_d u(k) + \mu(k) \end{cases}$$

or, in an equivalent manner $$\begin{cases} x_a(k+1) = A_a x_a(k) + B_a u(k) + \epsilon(k) \\ y(k) = C_a x_a(k) + D_a u(k) + \mu(k) \end{cases}$$

where $$x_a(k) = \begin{bmatrix} x(k) \\ w(k) \end{bmatrix}, \epsilon(k) = \begin{bmatrix} \epsilon_x(k) \\ \epsilon_m(k) \end{bmatrix}$$

and $$A_a = \begin{bmatrix} A_d & B_d \\ 0 & 1 \end{bmatrix}, B_a = \begin{bmatrix} -B_d \\ 0 \end{bmatrix}, C_a = [C_d \; D_d], D_a = -D_d$$

Thus the problem of estimating w(k) becomes a state estimation problem.

One way of estimating the unknown state vector $x_a(k)$, taking into account information about $\epsilon(k)$ and $\mu(k)$, is to apply the linear Kalman filter algorithm, as shown below. An alternative may be to use the moving-horizon estimation approach (the same approach used in the third embodiment to estimate the excitation force, viewed this time as an unknown input).

The linear Kalman filter (KF) algorithm provides a solution for the following optimization problem:

$$\min_{x_a(k)} = \left\{ (x_a(0) - \bar{x}_a(0))^T P_0^{-1} (x_a(0) - \bar{x}_a(0)) + \sum_{j=1}^{k} \epsilon(j-1)^T Q^{-1} \epsilon(j-1) + \mu(j)^T R^{-1} \mu(j) \right\}$$

where $P_0$, Q and R are calibration matrices of suitable dimensions, $\bar{x}_a(0)$ is the mean value of the initial state $x_a(0)$.

Considering $x_a(0)$ to be a random vector, not related to $\epsilon(k)$ and $\mu(k)$, of mean $\bar{x}_a(0)$ with covariance matrix $P_0$, and $\epsilon(k)$ and $\mu(k)$ as two random processes of the mean-zero white noise type with covariance matrices Q and R respectively, the problem of optimization may be solved using the linear Kalman filter algorithm.

At each instant k, the linear Kalman filter algorithm calculates the solution to this problem by use of two steps.

The first step is the temporal updating of the estimations:

$$\begin{cases} \hat{x}_a(k|k-1) = A_a \hat{x}_a(k-1|k-1) + B_a F_u(k-1) \\ P(k|k-1) = A_a P(k-1|k-1) A_a^T + Q \end{cases}$$

where $\hat{x}_a(k|k-1)$ and $P(k|k-1)$ are respectively the estimation of $x_a(k)$ and its covariance matrix obtained using the measurements from the instant k-1 (namely y(k-1), y(k-2), ... and $F_u(k-1)$, $F_u(k-2)$, ...), and $\hat{x}_a(k|k)$ and $P(k|k)$ are the estimation of $x_a(k)$ and its covariance matrix obtained using the measurements from the instant k (namely y(k), y(k-1), ... and $F_u(k)$, $F_u(k-1)$, ...).

The second step is the updating of the measurements:

$$\begin{cases} K(k) = P(k|k-1) C_a^T (C_a P(k|k-1) C_a^T + R)^{-1} \\ \hat{x}_a(k|k) = \hat{x}_a(k|k-1) + K(k)(y(k) - C_a \hat{x}_a(k|k-1) - D_a M_u(k)) \\ P(k|k) = (I - K(k) C_a(k)) P(k|k-1) \end{cases}$$

K(k) is the gain of the observer, which is a parameter vector which weights the errors between the estimations and the measurements of the outputs of the system (position and speed). In the case of the Kalman filter, it is not a calibration parameter, but it is obtained from the estimation of the covariance matrix.

To summarize, for the second embodiment, the following steps may be performed:
Initialization of k=0, $\hat{x}_a(0|0)=\hat{x}_a(0)$, $P(0|0)=P_0$
At each instant k:
 the following are used:
  the measurements of the position and speed of the moving part y(k)=[z(k) ż(k)] and the force applied by the PTO to the moving part u(k)=$F_u(k)$
  the results of the estimations of the preceding step $\hat{x}_a(k-1|k-1)$, $P(k-1|k-1)$
  the parameters Q, R (covariance matrices)
 determination of the excitation force $F_{ex}$ applied by the waves incident upon the moving part, known for this embodiment $\hat{w}(k)$, by performing the following steps:
  the two steps of the linear Kalman filter algorithm are applied to obtain $\hat{x}_a(k|k)$, P(k|k), thus the complete state with its covariance matrix are estimated:

$$\begin{cases} \hat{x}_a(k|k-1) = A_a \hat{x}_a(k-1|k-1) + B_a F_u(k-1) \\ P(k|k-1) = A_a P(k-1|k-1) A_a^T + Q \end{cases}$$

$$K(k) = P(k|k-1) C_a^T (C_a P(k|k-1) C_a^T + R)^{-1}$$
$$\hat{x}_a(k|k) = \hat{x}_a(k|k-1) + K(k)(y(k) - C_a \hat{x}_a(k|k-1) - D_a F_u(k))$$
$$P(k|k) = (I - K(k) C_a(k)) P(k|k-1)$$

where $x_a(k)$ is the unknown state vector $$x_a(k) = \begin{bmatrix} x(k) \\ w(k) \end{bmatrix},$$

$A_a$, $B_a$, $C_a$, $D_a$ are state realization matrices with P being the covariance matrix of the state vector and Q and R being calibration matrices,
and extraction of the last component of the last component of the estimated state vector, namely the excitation force $F_{ex}$ applied by the waves incident upon the moving part, by use of an equation with the form: $\hat{w}(k)=[0\ 1]\hat{x}_a(k|k)$ Third Embodiment According to the third embodiment of the invention, the excitation force applied by waves incident upon the moving part may be determined by use of an unknown input state estimator based on a moving-horizon approach. The moving-horizon estimation is an algorithm which determines recursively the state and the unknown input using data belong to a finite time window.

For this embodiment, prior to this step, the following are therefore known:
 the measurements of the position z, and speed ż of the moving part,
 the measurement of the force $F_u$ applied by the conversion machine (PTO) to the moving part,
 the model of the radiation force $F_{rad}(t)=-M_\infty \ddot{z}(t) - F_r(t)$ where $F_r(t)=\int_0^t h(t-\tau) \dot{z}(\tau) d\tau$, and
 the dynamics model of the wave-energy system $\ddot{z}(t)=F_{ex}(t)+F_{hd}(t)+F_{rad}(t)-F_u(t)$.

The second embodiment is completely linear and does not allow a non-linear (more precise) description of the hydrostatic restoring force to be taken into account directly.

This third embodiment overcomes this limitation. Unlike the second embodiment, the excitation force is no longer regarded as a global state model which represents the dynamics of the float, the evolution of which is described by a random-walk model. It is now regarded as an unknown input of a (slightly different) global model representing the dynamics of the float.

By combining the equation which describes the movement of the float according to the linear wave theory $$M\ddot{z}(t) = F_{ex}(t) + F_{hd}(t) + F_{rad}(t) - F_u(t)$$

and the expression for the radiation force $$F_{rad}(t) = -M_\infty \ddot{z}(t) - F_r(t)$$

The following is obtained $$(M+M_\infty)\ddot{z}(t) + F_r(t) = w(t) + u_d(t)$$

where $w(t)=F_{ex}(t)$ and $u_d(t)=F_{hd}(t)-F_u(t)$. $u_d(t)$ is regarded as a control input of the system described, known because $F_u(t)$ is measurable and $F_{hd}(t)$ may be calculated from a (linear or non-linear) model of the hydrostatic restoring force, while $w(t)$ is an unknown input (disturbance).

This equation may be expressed in state form, by defining $$\begin{cases} x_1(t) = z(t) \\ x_2(t) = \dot{z}(t) \end{cases}$$

which gives:

$$\begin{cases} \dot{x}_1(t) = x_2(t) \\ \dot{x}_2(t) = -\frac{1}{M+M_\infty}F_r(t) + \frac{1}{M+M_\infty}(w(t) - u_d(t)) \end{cases}$$

In the same way as for the second embodiment, using $$F_r(t) = \int_0^t h(t-\tau)\dot{z}(\tau)d\tau$$

the radiation damping $F_r(t)$ may be expressed as the output of a linear system in the form of a state-space representation, the input of which is $x_2(t)=\dot{z}(t)$ either $$\begin{cases} \dot{x}_r(t) = A_r x_r(t) + B_r \dot{z}(t) \\ F_r(t) = C_r x_r(t) + D_r \dot{z}(t) \end{cases}$$

or $$\begin{cases} \dot{x}_r(t) = A_r x_r(t) + B_r x_2(t) \\ F_r(t) = C_r x_r(t) + D_r x_2(t) \end{cases}$$

where $x_r$ is a (non-measurable) internal state not having any particular physical significance and ($A_r$, $B_r$, $C_r$, and $D_r$) are the state realization matrices By combining the two state-space representations, the following is obtained:

$$\begin{cases} \dot{x}_1(t) = x_2(t) \\ \dot{x}_2(t) = -\frac{D_r}{M+M_\infty}x_2(t) - \frac{C_r}{M+M_\infty}x_r(t) + \frac{1}{M+M_\infty}(w(t) - u_d(t)) \\ \dot{x}_r(t) = B_r x_2(t) + A_r x_r(t) \end{cases}$$

or, in an equivalent manner $$\begin{cases} \dot{x}(t) = A_c x(t) + B_c(w(t) + u_d(t)) \\ y(t) = C_c x(t) \end{cases}$$

where $$x(t) = [x_1(t) \ x_2(t) \ x_r^T(t)]^T$$

$$y = \begin{bmatrix} x_1(t) \\ x_2(t) \end{bmatrix}$$

and $$A_c = \begin{bmatrix} 0 & 1 & 0 \\ 0 & -\frac{D_r}{M+M_\infty} & -\frac{C_r}{M+M_\infty} \\ 0 & B_r & A_r \end{bmatrix},$$

$$B_c = \begin{bmatrix} 0 \\ \frac{1}{M+M_\infty} \\ 0 \end{bmatrix},$$

$$C_c = \begin{bmatrix} 1 & 0 & 0 \\ 0 & 1 & 0 \end{bmatrix}$$

It is attempted to estimate $w(t)$ using $y(t)$ (the vector which contains the measurements of the position and the speed of the float) and $u_d(t)$. It is pointed out that $u_d(t)=F_{hd}(t)-F_u(t)$ and that it is possible to use, for example, the piecewise affine approximation in order to calculate the hydrostatic restoring force:

$$F_{hd} = -F_i z(t) - G_i \text{ for each interval } \Omega_i, \text{ to which } z \text{ belongs.}$$

To do this, it is first possible to discretize the abovementioned state system (it should be remembered the measurements are sampled), using Tustin's method. This gives:

$$\begin{cases} x(k+1) = A_d x(k) + B_d w(k) + B_d u_d(k) \\ y(k) = C_d x(k) + D_d w(k) + D_d u_d(k) \end{cases}$$

To make the model more realistic by adding uncertainty factors (noise) to the state and the output:

$$\begin{cases} x(k+1) = A_d x(k) + B_d w(k) + B_d u_d(k) + \epsilon(k) \\ y(k) = C_d x(k) + D_d w(k) + D_d u_d(k) + \mu(k) \end{cases}$$

where $\epsilon(k)$ and $\mu(k)$ are mean-zero white noise.

In order to estimate the unknown input $w(k)$ (and secondarily the state $x(k)$ the moving-horizon estimation (MHE) method is used. The problem is estimating, at each time instant $k \geq N$, the state vector $x(k)$ and the unknown input $w(k)=F_{ex}(k)$, on the basis of:

- a priori estimations: $\hat{x}(k-N|k-1)$, $\hat{w}(k-N|k-1)$ (the estimations of $x(k-N)$ and $w(k-N)$ respectively) using the measurements from the time $k-1$;
- information about the outputs: $y(k-N)$, $y(k-N+1)$, ..., $y(k)$; and
- information about the known input: $u_d(k-N)$, $u_d(k-N+1)$, ..., $u_d(k)$ Namely:

$$\hat{x}_0 = \hat{x}(k-N|k-1)$$

$$\hat{w}_0 \hat{w}(k-N|k-1)$$

and:

$$x_j = \hat{x}(k-N+j|k)$$

$$w_j = \hat{w}(k-N+j|k)$$

$$\epsilon_j = \hat{\epsilon}(k-N+j|k)$$

for $j=0, 1, \ldots, N$.

The moving-horizon estimation problem is formulated as:

$$\min_{x_0, w_0, w_1, \ldots, \epsilon_1, \ldots, \epsilon_N} J(x_0, w_0, w_1, \ldots, \epsilon_1, \ldots, \epsilon_N)$$

with the following objective function (cost):

$$J = (\cdot) = \|x_0 - \hat{x}_0\|^2_{P_0^{-1}} + \|w_0 - \hat{w}_0\|^2_{Q_0^{-1}} +$$

$$\sum_{j=0}^{N-1} \|\epsilon_j\|^2_{Q^{-1}} + \sum_{j=0}^{N} \|y(k-N+j) - \hat{y}(k-N+j)\|^2_{R^{-1}} +$$

$$\sum_{j=0}^{N-1} \|w_j - w_{j-1}\|^2$$

where $$\hat{y}(k-N+j) = C_d x_j + D_d w_j + D_d u_d(k-N+j)$$

The notation $\|v\|^2_M$ indicates the product $v^T M v$ for a vector of reals v and a symmetrical matrix of reals M.

There are five terms in the cost function:
The first term $$\|x_0 - \hat{x}_0\|^2_{P_0^{-1}}$$

and the second term $$\|w_0 - \hat{w}_0\|^2_{Q_0^{-1}}$$

added together form the "arrival cost" which summarizes information prior to the time k−N and forms part of the data of the estimation problem.

The third term and the fourth term limit the method and measurement noise, respectively, with the weighting matrices Q and R.

The last term is a regularization term which has a function accounting for the fact that the excitation force of the waves is a regular (smooth) signal.

This latter term is important for determining the force applied by waves in an optimum manner. Another way of taking into account the "smooth" nature of the excitation force of waves would be imposing variation constraints thereon.

Using the classic approach of a moving-horizon estimation and control, the minimization of the cost function may be transformed into a quadratic programming QP problem (a quadratic programming problem is an optimization problem in which a quadratic function is minimized/maximized on a convex polyhedron) by propagating:

$$\begin{cases} x(k+1) = A_d x(k) + B_d w(k) + B_d u_d(k) + \epsilon(k) \\ y(k) = C_d x(k) + D_d w(k) + D_d u_d(k) + \mu(k) \end{cases}$$

over time. This gives:

$$x_1 = A_d x_0 + B_d w_0 + B_d u_d(k-N) + \epsilon_0$$

$$x_2 = A_d x_1 + B_d w_1 + B_d u_d(k-N+1) + \epsilon_1$$
$$= A_d^2 x_0 + A_d B_d w_0 + B_d w_1 + A_d B_d u_d(k-N) +$$
$$B_d u_d(k-N+1) + A_d \epsilon_0 + \epsilon_1$$

$$\vdots$$

$$x_n = A_d^N x_0 + A_d^{N-1} B_d w_0 + \ldots + B_d w_{N-1} +$$
$$A_d^{N-1} B_d u_d(k-N) + \ldots + B_d u_d(k-1) + A_d^{N-1} \epsilon_0 + \ldots + \epsilon_1$$

or, in compact form, $$X = \Phi_x x_0 + \Psi_x W + \Psi_x U_d + \Gamma_x E$$

where $$X = \begin{bmatrix} x_1 \\ x_2 \\ \vdots \\ A_N \end{bmatrix}, W = \begin{bmatrix} w_1 \\ w_2 \\ \vdots \\ w_N \end{bmatrix}, U_d = \begin{bmatrix} u_d(k-N) \\ u_d(k-N+1) \\ \vdots \\ u_d(k) \end{bmatrix}, E = \begin{bmatrix} \epsilon_1 \\ \epsilon_2 \\ \vdots \\ \epsilon_N \end{bmatrix}$$

and $$\Phi_x = \begin{bmatrix} A_d \\ A_d^2 \\ \vdots \\ A_d^N \end{bmatrix}, \Psi_x = \begin{bmatrix} B_d & 0 & \ldots & 0 & 0 \\ A_d B_d & B_d & \ldots & 0 & 0 \\ \vdots & \vdots & \ddots & \vdots & \vdots \\ A_d^{N-1} B_d & A_d^{N-2} B_d & \ldots & B_d & 0 \end{bmatrix},$$

$$\Gamma_x = \begin{bmatrix} I & 0 & \ldots & 0 \\ A_d & I & \ldots & 0 \\ \vdots & \vdots & \ddots & \vdots \\ A_d^{N-1} & A_d^{N-2} & \ldots & I \end{bmatrix}$$

Applying the same approach to the output equation and introducing the notations $$Y = [y(k-N+1)^T \; y(k-N+2)^T \; y(k)^T]^T,$$

$$\Phi_y = \begin{bmatrix} C_d A_d \\ C_d A_d^2 \\ \vdots \\ C_d A_d^N \end{bmatrix},$$

$$\Psi_y = \begin{bmatrix} C_d B_d & D_d & \ldots & 0 & 0 \\ C_d A_d B_d & C_d B_d & \ldots & 0 & 0 \\ \vdots & \vdots & \ddots & \vdots & \vdots \\ C_d A_d^{N-1} B_d & C_d A_d^{N-2} B_d & \ldots & C_d B_d & D_d \end{bmatrix},$$

$$\Gamma_y = \begin{bmatrix} C_d & 0 & \ldots & 0 \\ C_d A_d & C_d & \ldots & 0 \\ \vdots & \vdots & \ddots & \vdots \\ C_d A_d^{N-1} & C_d A_d^{N-2} & \ldots & C_d \end{bmatrix}$$

results in a QP problem with the form:

$$\begin{cases} \min_{\xi} \left\{ \xi^T (P + \Psi_s^T R \Psi_s) \xi - 2[\hat{w}_0^T \; \hat{x}_0^T \; V^T] \begin{bmatrix} S \\ R \Psi_s \end{bmatrix} \xi \right\} \\ \text{such as } H_\xi \xi \leq g_\xi + H_d U_d \end{cases}$$

where

-continued $$\begin{cases} \xi = [W^T \ x_0^T \ E^T] \\ V = Y - \Psi_y U_d \\ \Psi_s = [\Psi_y \ \Phi_y \ \Gamma_y] \end{cases}$$

where $\xi$ is a matrix which represents all the unknown variables to be estimated (the values of the unknown input $W^T$ and the uncertainty about the state $E^T$ for all the N steps of the estimation window considered, and the initial state $x_0^T$ at the time k−N), $\Psi_s$ is a matrix which includes the effects of these same unknown variables on the values output in the estimation window Y, $\Psi_y$ is a matrix which corresponds to the effects of the known input $U_d$ on Y, $\Psi_y$ $\Psi_y$ and $\Psi_s$ calculated based on the state-space representation defined above, and P, R and S are matrices formed from weighting matrices of the cost function Q, R, $Q_0^{-1}$, $R_0^{-1}$ and the regularization parameter $\lambda$ as follows:

$$Q = \begin{bmatrix} Q^{-1} & 0 & \cdots & 0 \\ 0 & Q^{-1} & \cdots & 0 \\ \vdots & \vdots & \ddots & \vdots \\ 0 & 0 & \cdots & Q^{-1} \end{bmatrix}, R = \begin{bmatrix} R^{-1} & 0 & \cdots & 0 \\ 0 & R^{-1} & \cdots & 0 \\ \vdots & \vdots & \ddots & \vdots \\ 0 & 0 & \cdots & R^{-1} \end{bmatrix},$$

$$\Lambda_1 = \begin{bmatrix} Q_0^{-1}-\lambda & \lambda & 0 & 0 & \cdots & 0 & 0 \\ 0 & -\lambda & \lambda & 0 & \cdots & 0 & 0 \\ 0 & 0 & -\lambda & \lambda & \cdots & 0 & 0 \\ \vdots & \vdots & \vdots & \vdots & \ddots & \vdots & \vdots \\ 0 & 0 & 0 & 0 & \cdots & \lambda & 0 \\ 0 & 0 & 0 & 0 & \cdots & -\lambda & \lambda \end{bmatrix},$$

$$P = \begin{bmatrix} \Lambda_1 & 0 & 0 \\ 0 & P_0^{-1} & 0 \\ 0 & 0 & Q \end{bmatrix}, S = \begin{bmatrix} Q_0^{-1} & 0 & \cdots & 0 \\ 0 & P_0^{-1} & \cdots & 0 \end{bmatrix}$$

To conclude $$H_\xi \xi \le g_\xi + H_d U_d$$

is a linear inequality which, with the aid of the matrices $H_\xi$ and $H_d$ and the vector $g_\xi$, retranscribes in compact form polytopic constraints on the unknown input and state:

$$\begin{cases} w \in P_w, P_w = \{w: H_w \le g_w\}, g_w > 0 \\ x \in P_x, P_x = \{x: H_x \le g_x\}, g_x > 0 \end{cases}$$

which in turn are defined by the matrices $H_w$ and $H_x$ and the vectors $g_w$ and $g_x$. With this inequality, it is possible to take into account information about the minimum and maximum amplitudes of the excitation force of the incident waves, and the position and speed of the float.

The moving-horizon estimation problem is a constrained quadratic programming problem which may be resolved with solvers such as FORCES® (Embotech, Suisse) or CVXGEN® (CVXGEN LLC, USA) for example.

Let it be assumed that is the solution of the dynamic programming problem obtained with one of these solvers. The estimation of the excitation forces, using measurements at the time k, is given by:

$$\hat{w}(k-N+j|k)=\xi^*(j), \forall j=1,2,\ldots,N$$

To summarize, for the third embodiment, the steps described below may be performed.

The components of the vectors of the past estimations and measurements corresponding to the N−1 time step preceding the present instant k=0 are initialized to zero.

At each instant k,
1. The following are acquired:
    the measurements of the position and the speed of the moving part y(k)=[z(k) ż(k)] and of the force applied by the PTO to the moving part u(k)=$F_u$(k),
    the results of the estimations of the preceding time step $\hat{x}_d$(k−N|k−1), ŵ(k−N|k−1)
    the parameters Q, R, $Q_0^{-1}$, $R_0^{-1}$ (weighting matrices) and λ (regularization)
2. The calculation ŵ(k|k) is carried out, this corresponding to the estimation of the force applied by waves to the moving part, by performing the following steps:
    i. The following quadratic programming problem QP is resolved to obtain the solution $\xi^*$ $$\begin{cases} \min_\xi \left\{ \xi^T(P + \Psi_s^T R \Psi_s)\xi - 2[\hat{w}_0^T \ \hat{x}_0^T \ V^T] \begin{bmatrix} S \\ R\Psi_s \end{bmatrix} \xi \right\} \\ \text{such as } H_\xi \xi \le g_\xi + H_d U_d \end{cases}$$

ii. The excitation force applied by waves incident upon the moving part w(k) is estimated by use of an equation with the form:

$$\hat{w}(k|k)=\xi^*(N).$$

6) Controlling of the Wave-Energy System

During this step, the wave-energy system is controlled to account for the excitation force applied by the incident wave. Thus it is possible to drive the wave-energy system to optimize the recovered energy.

Controlling may be controlling the moving part of the wave-energy system, for example by use of an electric, pneumatic or hydraulic PTO conversion machine. The PTO system influences the movement of the moving part and allows the mechanical energy to be transferred to the electrical, pneumatic or hydraulic network. Model predictive control (MPC) is an example of a method for controlling wave-energy systems.

ILLUSTRATIVE EXAMPLE

In order to illustrate the advantages of the method according to the invention, the method according to the invention was tested in a tank. The wave-energy system corresponds to the wave-energy system shown in FIG. 1. The wave-energy system is equipped with a torque sensor for measuring the torque applied by the wave to the moving part. Beforehand, the torque applied by the wave is determined in the case where control is not active (namely the conversion machine does not generate any torque on the system) and the float is kept in an equilibrium position. These characteristics allow the excitation torque applied by the wave incident upon the moving part for this first test to be compared with other tests when the float is moving and the electrical machine is activated.

Figure 3:
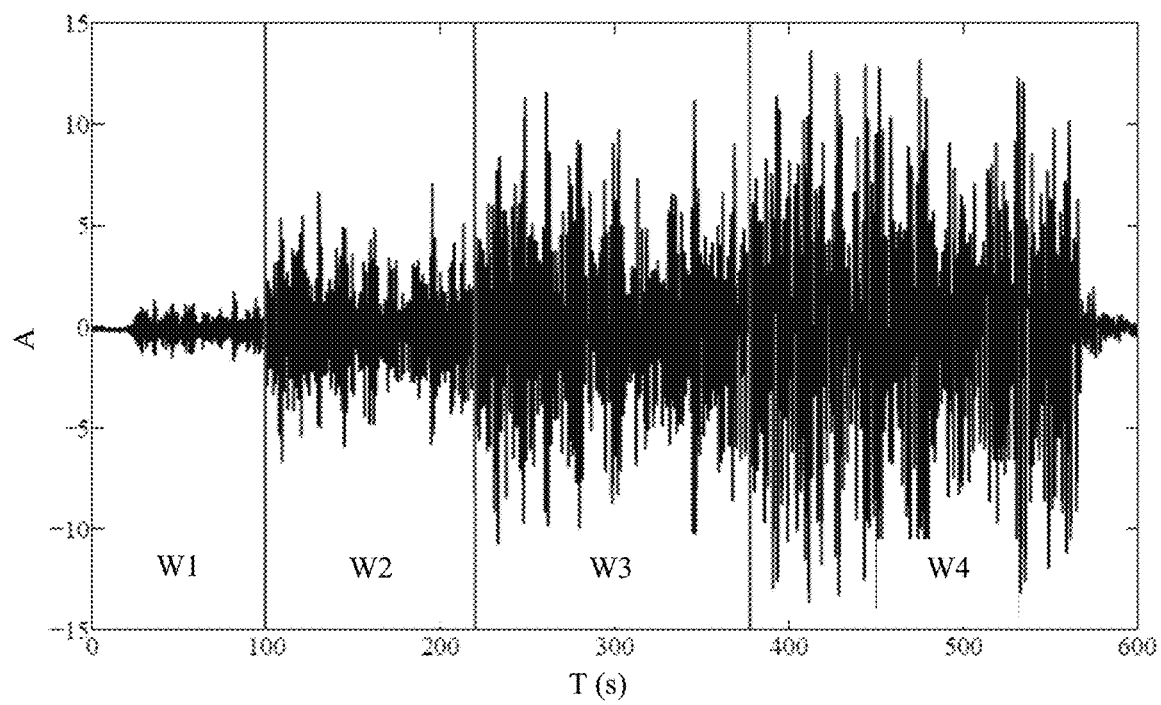
FIG. 3 shows the amplitude of waves for implementation of the illustrative example.

For the present analysis, a series of four types of different waves is considered. These four types of wave W1, W2, W3, W4 (from smallest to largest amplitude) are shown in FIG. 3 which illustrates the amplitude A as a function of the time T.

Figure 4A:
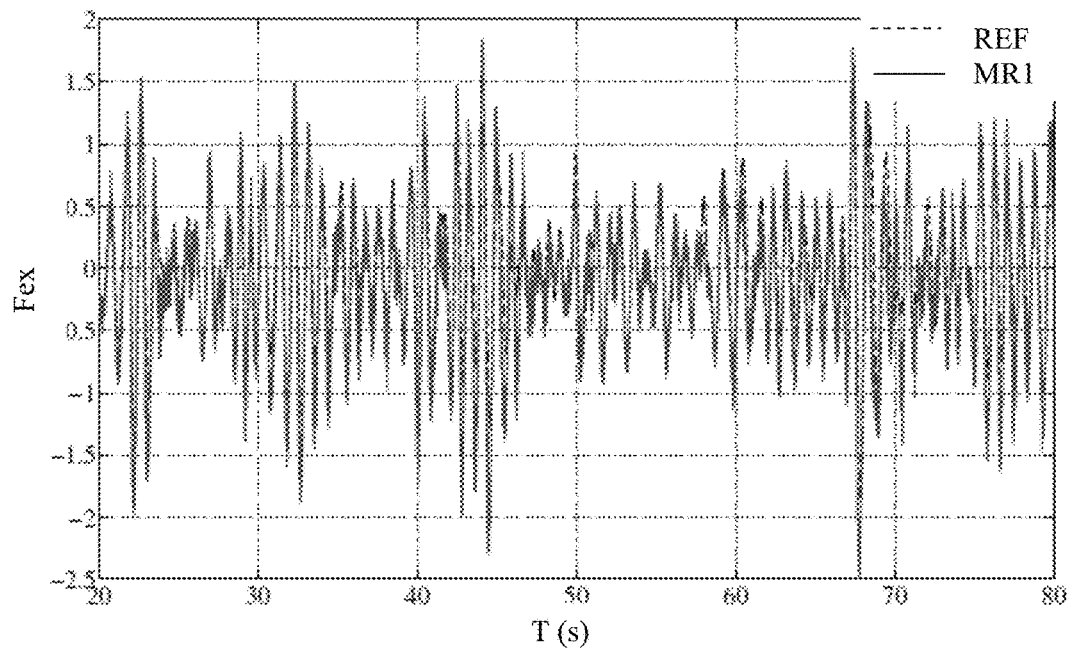
FIGS. 4*a* to 4*c* show the excitation force applied by waves incident upon the moving part as a function of time, for a wave of the type W1 according to FIG. 3 obtained by measurement and respectively by one of the embodiments of the method according to the invention.
Figure 4B:
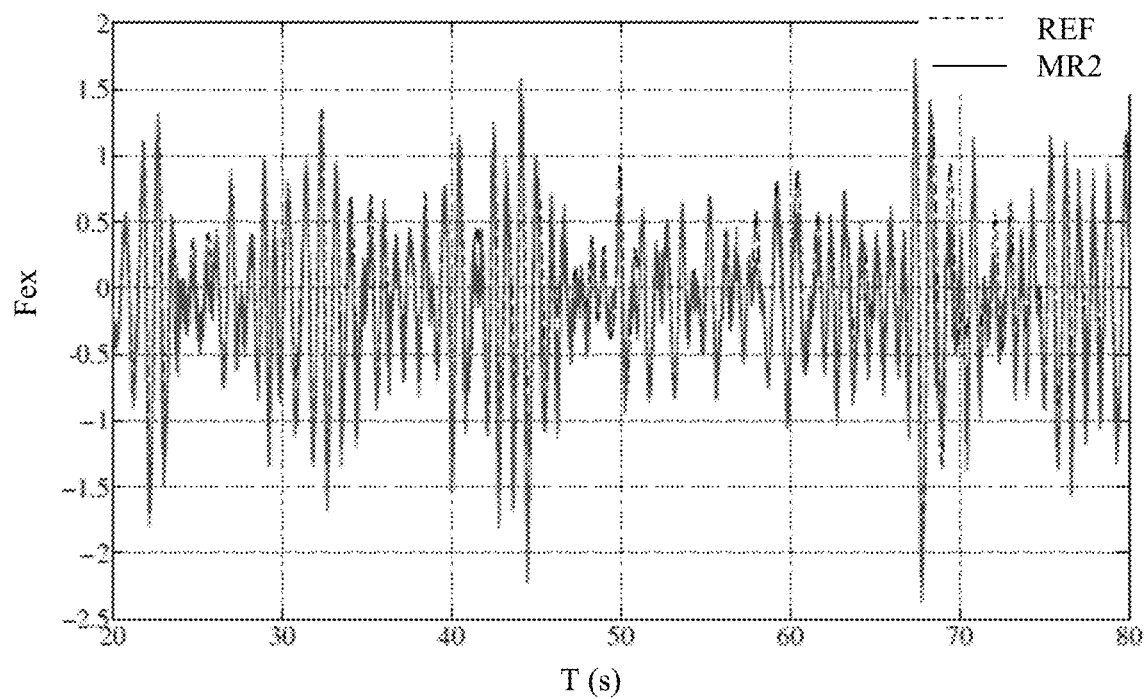
Figure 4C:
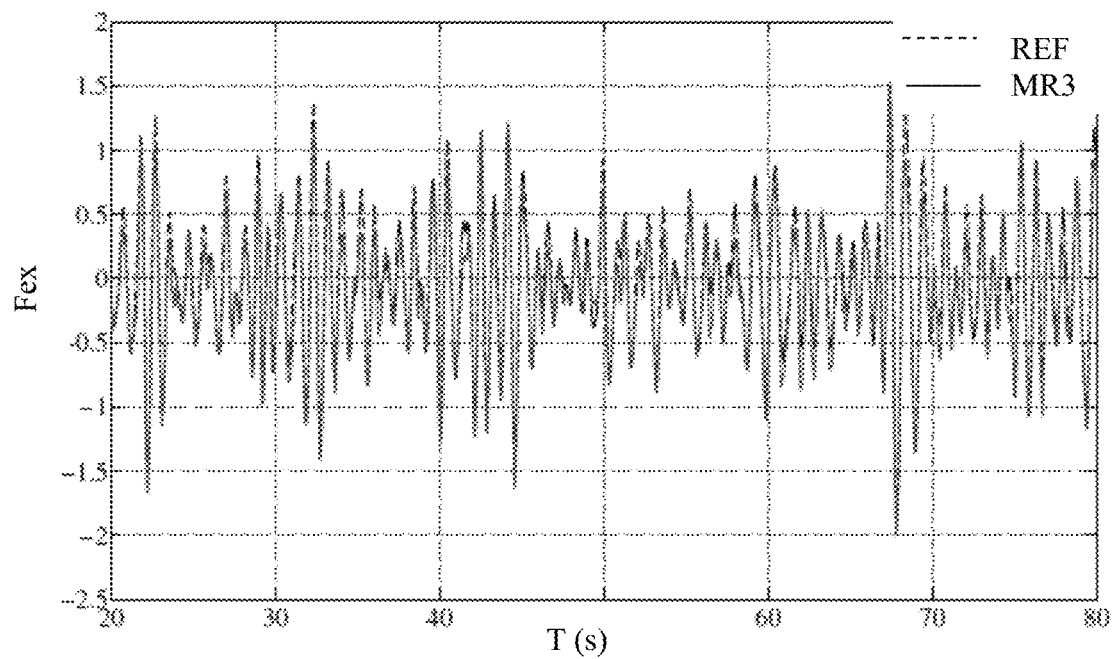

FIGS. 4a to 4c show a comparison of the excitation reference force (in this case the torque) applied by the wave incident upon the moving part, with the excitation force (in this case the torque) applied by the wave incident upon the moving part determined according to an embodiment of the invention. FIGS. 4a to 4c correspond to a wave of the type W1 shown in FIG. 3. The reference wave is indicated by REF and shown as a broken line. The forces of the incident wave determined by the method according to the invention are shown as a continuous line. FIG. 4a corresponds to the first embodiment of the invention MR1, FIG. 4b corresponds to the second embodiment of the invention MR2 and FIG. 4c corresponds to the third embodiment of the invention MR3. It should be noted in these FIGS. 4a to 4c that, in all three embodiments, the graph representing the force determined by the method according to the invention is more or less superimposed on the graph representing the reference force. Thus, with the method according to the invention, it is possible to determine precisely the excitation force of the wave incident upon the moving part.

Figure 5A:
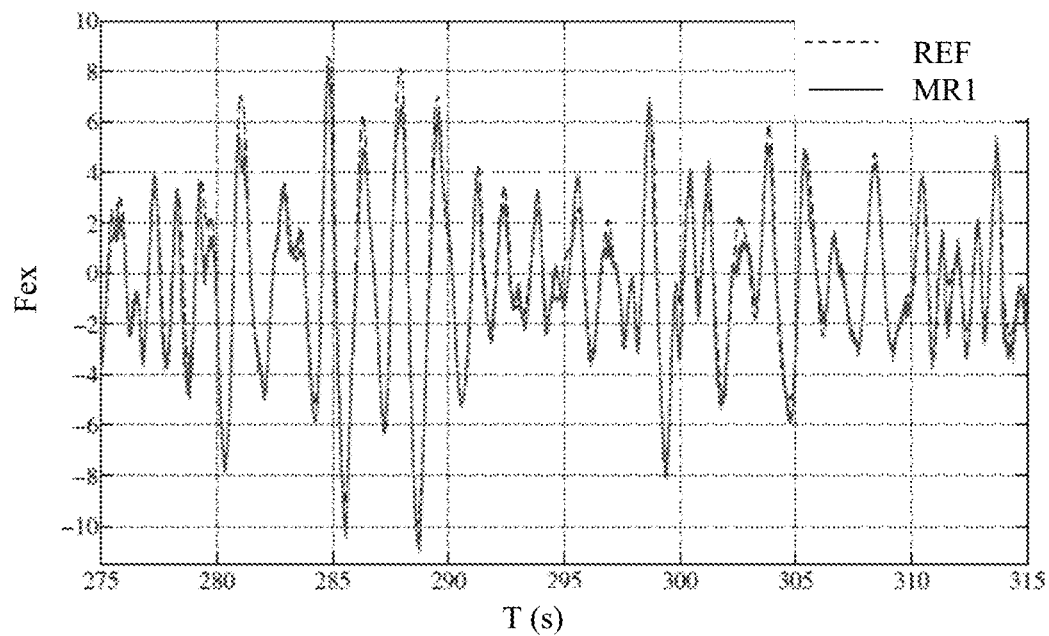
FIGS. 5*a* to 5*c* show the excitation force applied by waves incident upon the moving part as a function of time, for a wave of the type W3 according to FIG. 3, obtained by measurement respectively by one of the embodiments of the method according to the invention.
Figure 5B:
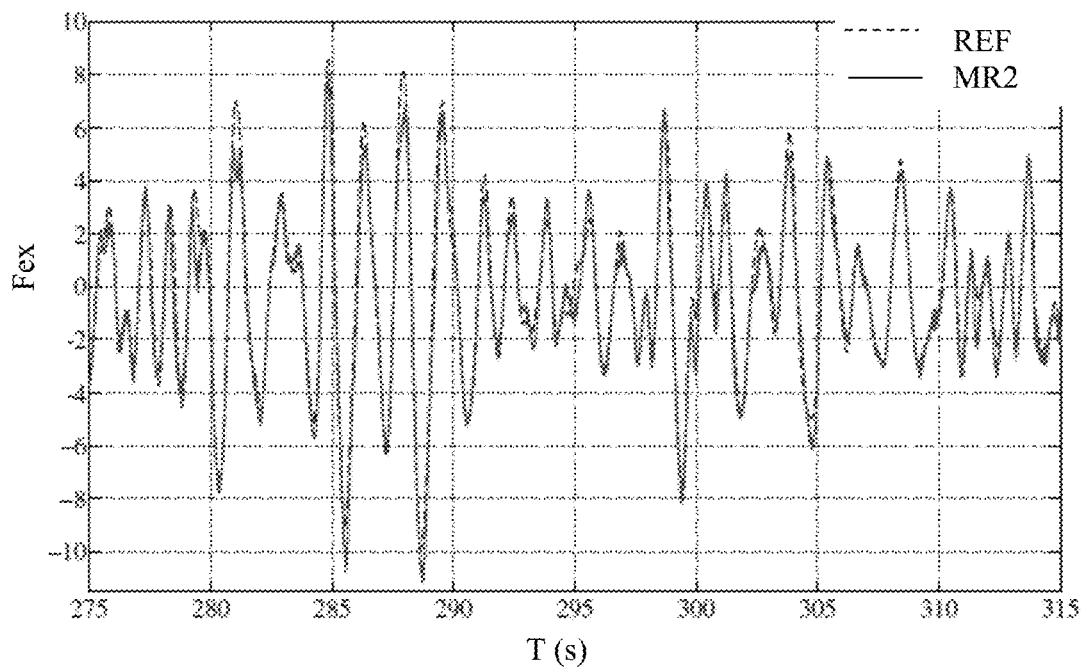
Figure 5C:
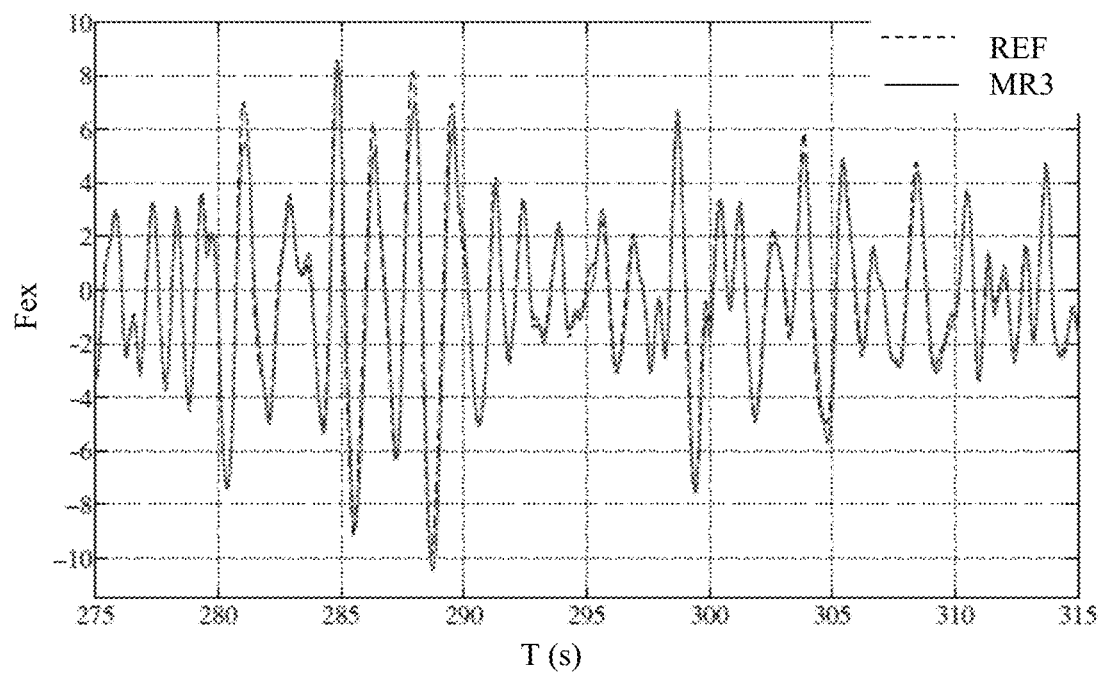

FIGS. 5a to 5c show a comparison of the excitation reference force (in this case the torque) applied by waves incident upon the moving part, with the excitation force (in this case the torque) applied by waves incident upon the moving part determined according to an embodiment of the invention. FIGS. 5a to 5c correspond to a wave of the type W3 shown in FIG. 3. The reference wave is indicated by REF and shown as a broken line. The forces of the wave determined by the method according to the invention are shown as a continuous line. FIG. 5a corresponds to the first embodiment of the invention MR1, FIG. 5b corresponds to the second embodiment of the invention MR2 and FIG. 5c corresponds to the third embodiment of the invention MR3. It can noted in these FIGS. 5a to 5c that, in all three embodiments, the graph representing the force determined by the method according to the invention is more or less superimposed on the graph representing the reference force. Thus, with the method according to the invention, it is possible to determine precisely the excitation force of the wave incident upon the moving part. It is also possible to note that the error between the reference force and the force which is determined is smaller for these graphs than for the graphs shown in FIGS. 4a to 4c.

The invention claimed is:

1. A method for controlling a wave-energy system for generating exploitable energy, the system including a floating moving part which moves in response to waves incident on the floating moving part and which drives a power take-off system comprising one of an electric, pneumatic or hydraulic conversion machine with an excitation force Fex produced in response to the waves incident on the floating moving part, a moveable member pivotally attached to the floating moving part which is coupled to the power take-off system for influencing the moving part by transferring energy from the power take-off system to the floating moving part, and allowing transfer of mechanical energy from the floating moving part, to an electrical, pneumatic or hydraulic network, the method comprising:
   a) measuring position and speed of the floating moving part in relation to an equilibrium position thereof;
   b) measuring a force Fu applied by the power take-off system to the floating moving part;
   c) constructing a linear model of radiation force Frad relating acceleration and speed of the floating moving part;
   d) constructing a model of dynamics of the wave-energy system which relates the excitation force Fex to the position of the floating moving part, to the speed of the floating moving part, and to the force Fu applied by the power take-off system of the floating moving part;
   e) determining the excitation force Fex produced in response to the incident waves to the floating moving part by use of the model of dynamics, the model of the radiation force Frad, a measured position and speed of the floating moving part in step a, and the force Fu applied by the power take-off to the floating moving part; and
   f) controlling the operation of the wave energy system by controlling the power take-off system dependent on the determined excitation force Fex applied by the waves incident on the floating moving part to adjust recovery of exploitable energy as a function of the determined excitation force Fex applied by the waves incident on the floating moving part.

2. The method as claimed in claim 1, wherein the model of dynamics of the wave-energy system is constructed by use of an equation: $M\ddot{z}(t)=F_{ex}(t)+F_{hd}(t)+F_{rad}(t)-F_u(t)$ where M is the mass of the floating moving part, $\ddot{z}$ is acceleration of the floating moving part, and $F_{hd}$ is a hydrostatic restoring force applied to the floating moving part.

3. The method as claimed in claim 2, wherein the hydrostatic restoring force $F_{hd}$ is determined by using a formula:
   $F_{hd}(t)=-Kz(t)$ where z is a position of the floating moving part and K is a hydrostatic stiffness coefficient.

4. The method as claimed in claim 3, wherein radiation damping $F_r$ is determined by use of an approximated time response obtained from a state realization: $F_r(t)=C_r\int_0^t e^{(t-\tau)A_r}B_r\dot{z}(\tau)d\tau+D_r\dot{z}(t)$ where $A_r$, $B_r$, $C_r$, and $D_r$ are state realization matrices.

5. The method as claimed in claim 2, wherein the hydrostatic restoring force $F_{hd}$ is determined by a piecewise affine function: $F_{hd}=-F_iz(t)-G_i$ for at least two variation intervals $\Omega_i$ of a position z, where $F_i$ and $G_i$ are constant coefficients of the piecewise affine function for each interval $\Omega_i$.

6. The method as claimed in claim 5, wherein the excitation force Fex applied by the waves incident to the floating moving part is determined by use of an equation: $\hat{F}_{ex}(k)=(M+M_\infty)\ddot{z}(k)+\Sigma_{l=0}^{k-1}C_{rd}A_{rd}^{k-1-l}B_{rd}\dot{z}(l)+D_{rd}\dot{z}(k)+F_iz(k)+G_i+F_u(k)$ where k is a time step in a discrete domain, and $A_{rd}$, $B_{rd}$, $C_{rd}$, and $D_{rd}$ are state realization matrices in the discrete domain.

7. The method as claimed in claim 2, wherein acceleration of the floating moving part is measured.

8. The method as claimed in claim 2, wherein excitation force Fex applied by the waves incident on the floating moving part is determined by an equation:
   $\hat{F}_{ex}(k)=(M+M_\infty)\ddot{z}(k)+\Sigma_{l=0}^{k-1}C_{rd}A_{rd}^{k-1-l}B_{rd}\dot{z}(l)+D_{rd}\dot{z}(k)+F_iz(k)+G_i+F_u(k)$ where k is time step in a discrete domain, and $A_{rd}$, $B_{rd}$, $C_{rd}$, and $D_{rd}$ are state realization matrices in a discrete domain.

9. The method as claimed in claim 1, wherein the model of the radiation force $F_{rad}$ is constructed by an equation:
   $F_{rad}(t)=-M_\infty\ddot{z}(t)-F_r(t)$ where $F_r(t)=\int_0^t h(t-\tau)\dot{z}(\tau)d\tau$ is radiation damping, $\ddot{z}$ is acceleration of the floating moving part, and $M_\infty$ is mass added to an infinitely high frequency, $\dot{z}$ is speed of the floating moving part, and h is a pulse response relating speed of floating moving part to radiation damping.

10. The method as claimed in claim 9, wherein the acceleration of floating moving part is measured.

11. The method as claimed in claim 10, wherein the radiation damping $F_r$ is determined by use of an approximated time response obtained from a state realization: $F_r(t)=C_r\int_0^t e^{(t-\tau)A_r}B_r\dot{z}(\tau)d\tau+D_r\dot{z}(t)$ where $A_r$, $B_r$, $C_r$, and $D_r$ are state realization matrices.

12. The method as claimed in claim 11, wherein excitation force Fex applied by the waves incident on the floating moving part is determined by an equation:

$\hat{F}_{ex}(k)=(M+M_\infty)\ddot{z}(k)+\Sigma_{l=0}^{k-1}C_{rd}A_{rd}^{k-1-l}B_{rd}\dot{z}(l)+D_{rd}\dot{z}(k)+F_iz(k)+G_i+F_u(k)$ where k is time step in a discrete domain, and $A_{rd}$, $B_{rd}$, $C_{rd}$, and $D_{rd}$ are state realization matrices in a discrete domain.

13. The method as claimed in claim 9, wherein the excitation force Fex applied by the waves incident on the floating moving part is determined by use of a state observer based on a linear Kalman filter constructed from a random-walk model of the excitation force Fex applied by the waves incident on the floating moving part; and wherein the excitation force Fex applied by the waves incident on the floating moving part is determined by performing steps of:
i) initialization of k=0, state vector $\hat{x}_a(0|0)=\bar{x}_a(0)$ and state of the covariance matrix, $P(0|0)=P_0$;
ii) at each instant k, acquisition of the position and speed measurements of floating moving part $y(k)=[z(k)\ \dot{z}(k)]$ and measurement of force exerted by the power take-off on the floating moving part $u(k)=F_u(k)$; and
iii) at each instant k, determination of the excitation force Fex applied by incident waves on the floating moving part (2) $\hat{w}(k)$ by use of the equations:

$\hat{w}(k)=[0\ 1]\hat{x}_a(k|k)$ where:

$$\begin{cases}\hat{x}_a(k|k-1)=A_a\hat{x}_a(k-1|k-1)+B_aF_u(k-1)\\ P(k|k-1)=A_aP(k-1|k-1)A_a^T+Q\end{cases},$$

$K(k)=P(k|k-1)C_a^T(C_aP(k|k-1)C_a^T+R)^{-1}$
$\hat{x}_a(k|k)=\hat{x}_a(k|k-1)+K(k)(y(k)-C_a\hat{x}_a(k|k-1)-D_aF_u(k))$
$P(k|k)=(1-K(k)C_a(k))P(k|k-1)$ where K(k) is gain of an observer, $x_a(k)$ is an unknown state vector, $$x_a(k)=\begin{bmatrix}x(k)\\w(k)\end{bmatrix},$$

$A_a$, $B_a$, $C_a$, and $D_a$ are state realization matrices, P is a covariance matrix of the unknown state vector, and Q and R are calibration matrices.

14. The method as claimed in claim 9, wherein excitation force Fex applied by the waves incident on the floating moving part is determined by use of an unknown input state estimator based on a moving-horizon method.

15. The method as claimed in claim 14, wherein the excitation force Fex applied by the incident waves on the floating moving part is determined by performing the following steps at each time instant k:
i) acquisition of position and speed measurements of the floating moving part and measurement of the force Fex $y(k)=[z(k)\ \dot{z}(k)]$ and measurement of the force applied by the conversion machine to the floating moving part $u(k)=F_u(k)$; and
ii) determination of the excitation force Fex applied by the incident waves on the floating moving part $\hat{w}(k|k)$ by use of the equations:

$\hat{w}(k|k)=\xi(N)$ where (N) is obtained by resolution of a following quadratic programming problem:

$$\begin{cases}\min_\xi\left\{\xi^T(P+\Psi_s^TR\Psi_s)\xi-2[\hat{w}_0^T\ \hat{x}_0^T\ V^T]\begin{bmatrix}S\\R\Psi_s\end{bmatrix}\xi\right\}\\ \text{such as } H_\xi\xi\le g_\xi+H_dU_d\end{cases}$$

where P, R and S are matrices formed from matrices for weighting of a cost function, $\xi$ is a matrix which represents all the values of unknown variables in an estimation window of size N, $\Psi_s$ is a matrix, calculated from a state-space representation, corresponding to an effect of variables on output values an identical window, $H_\xi$ and $H_d$ are matrices and $g_\xi$ is a vector obtained from constraints imposed on the state representation and an unknown input,
$\hat{x}_0=\hat{x}(k-N|k-1)$ and $\hat{w}_0=(k-N|k-1)$ where x is a state vector and w is an unknown input of the state estimator, $$U_d=\begin{bmatrix}u_d(k-N)\\u_d(k-N+1)\\\vdots\\u_d(k)\end{bmatrix},$$

$u_d$ being the known input of state estimator with $u_d(t)=F_{hd}(t)-F_u(t)$.

* * * * *